United States Patent [19]

McDermott et al.

[11] Patent Number: 5,209,028
[45] Date of Patent: May 11, 1993

[54] APPARATUS TO CLEAN SOLID SURFACES USING A CRYOGENIC AEROSOL

[75] Inventors: Wayne T. McDermott, Allentown, Pa.; Jin J. Wu, Ossining, N.Y.; Richard C. Ockovic, Northampton, Pa.

[73] Assignees: Air Products and Chemicals, Inc., Allentown, Pa.; International Business Machines Corporation, Armonk, N.Y.

[21] Appl. No.: 958,417

[22] Filed: Oct. 9, 1992

Related U.S. Application Data

[63] Continuation of Ser. No. 869,562, Apr. 15, 1992, abandoned.

[51] Int. Cl.[5] .............................................. B24C 1/00
[52] U.S. Cl. ........................................ 51/426; 134/7; 51/417; 51/421; 51/439
[58] Field of Search ............... 51/410, 413, 417, 419, 51/421, 426, 427, 319, 320, 16, 19, 231, 233, 283 R, 240 T, 240 R, 439; 134/7

[56] References Cited

U.S. PATENT DOCUMENTS

| 1,899,626 | 2/1933 | Miller . | |
| 3,270,464 | 9/1966 | Bowling, Jr. et al. | 51/15 |
| 3,545,996 | 12/1970 | Duncan | 117/8 |
| 3,934,374 | 1/1976 | Leliaert | 51/426 |
| 3,984,943 | 10/1976 | Konu et al. | 51/8 |
| 4,084,357 | 4/1978 | Moses | 51/419 |
| 4,631,250 | 12/1986 | Hayashi | 430/329 |
| 4,663,890 | 5/1987 | Brandt | 51/283 |
| 4,705,438 | 11/1987 | Zimmerman | 51/235 |
| 4,747,421 | 5/1988 | Hayashi | 134/201 |
| 4,753,051 | 6/1988 | Tano | 51/426 |
| 4,793,103 | 12/1988 | Baumgart | 51/418 |
| 4,817,652 | 4/1989 | Liu et al. | 134/102 |
| 4,832,753 | 5/1989 | Cherry et al. | 134/122.18 |
| 4,936,922 | 6/1990 | Cherry | 134/22.18 |
| 4,962,891 | 10/1990 | Layden | 239/597 |
| 4,974,375 | 12/1990 | Tada et al. | 51/413 |
| 5,009,240 | 4/1991 | Levi | 134/7 |
| 5,062,898 | 11/1991 | McDermolt et al. | 134/7 |
| 5,074,083 | 12/1991 | Kanno et al. | 51/410 |

Primary Examiner—Bruce M. Kisliuk
Assistant Examiner—Jack Lavinder
Attorney, Agent, or Firm—Geoffrey L. Chase; James C. Simmons; William F. Marsh

[57] ABSTRACT

The present invention is an apparatus for cleaning semi-conductor solid surfaces using a spray of frozen cryogen, such as argon, to impinge on the solid surface to remove contaminant particles. The apparatus includes an appropriate nozzle positioned in a housing designed for ultra clean conditions including sweep gas supply and evacuation conduits and a support table movably positioned within the housing to controllably convey the semi-conductor solid surface on a track under the spray of frozen cryogen emanating from the nozzle.

22 Claims, 5 Drawing Sheets

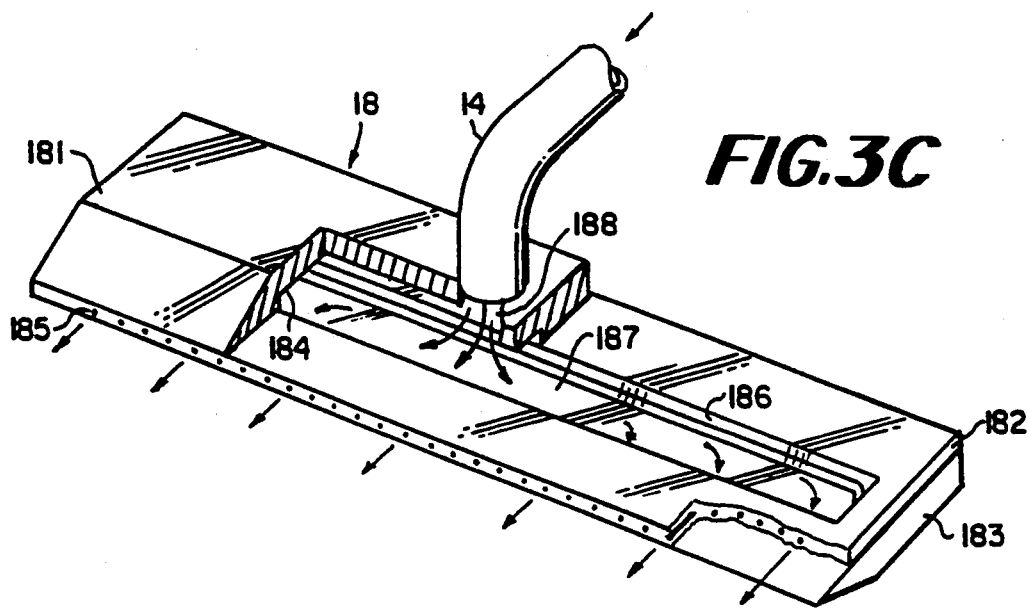
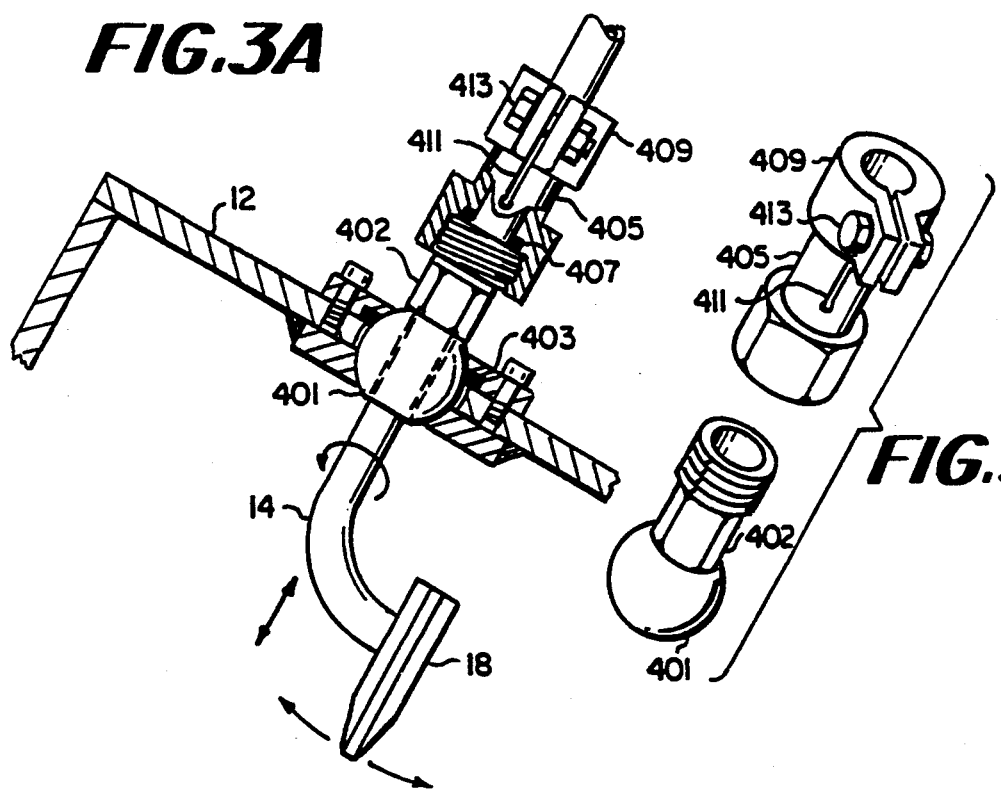

APPARATUS TO CLEAN SOLID SURFACES USING A CRYOGENIC AEROSOL

This is a continuation of application Ser. No. 07/869,562 filed Apr. 15, 1992, now abandoned.

FIELD OF THE INVENTION

The present invention is directed to an apparatus for cleaning sensitive solid surfaces of particulate contamination using a spray of frozen particles to displace the contaminating particles and wherein thereafter the frozen particles melt or preferably sublime. More specifically, the present invention is an apparatus for spraying frozen argon particles at a semi-conductor substrate to remove contaminating particles wherein the argon sublimes after impingement against the semi-conductor surface.

BACKGROUND OF THE PRIOR ART

Several methods are presently used to clean surfaces for the electronics industry. Solvent or chemical cleaning is used to remove contaminant films from surfaces. Since solvents are selected for the materials they can dissolve, an appropriate solvent must be chosen to remove contamination. Chemical solutions can be combined with megasonic or ultrasonic cleaners. These devices impart high energy sonic waves to the surface which can remove organic films, ionic impurities and particles as small as about 3,000 angstroms. However, solvent or chemical cleaning requires extremely pure and clean agents. High purity and cleanliness is difficult and/or expensive to achieve in liquid agents. In addition, the agent becomes progressively more contaminated as it is used and must be disposed of periodically. Failure to change the agent periodically causes redeposition of contaminants, which reduces the effectiveness of the cleaning process. Disposal of such agents frequently results in environmental damage. Also, such agents require special safety procedures during handling in order to minimize exposure to operators.

Gas jet and liquid spray cleaning are presently used to clean relatively large particles from silicon wafers. Gas jets, such as filtered nitrogen, are effective in removing particles smaller than about 50,000 angstroms. Smaller particles are more difficult to remove. This is because the adhesive force tending to hold the particle to the surface is approximately proportional to the particle diameter while the aerodynamic drag force by the gas tending to remove the particle is approximately proportional to the diameter squared. Therefore, the ratio of these forces tends to favor adhesion as the particle size shrinks. Also, smaller particles are not exposed to strong drag forces in the jet since they can lie within the surface boundary layer where the gas velocity is low. Liquid jets provide stronger shear forces to remove particles, but are expensive and/or difficult to obtain in high purity and may leave contaminating residues after drying. Also, a common liquid spray solvent comprising a chlorofluoro carbon, FREON TF, is environmentally damaging. Alternatively, the art has used exposure to ozone combined with ultraviolet light to decompose contaminating hydrocarbons from surfaces of semiconductors. However, this technique has not yet been shown to remove contaminating particles with any efficacy.

A recently developed cleaning technique involves the use of a carbon dioxide aerosol to sandblast contaminated surfaces. Pressurized carbon dioxide is expanded in a nozzle. The expansion drops the carbon dioxide pressure to atmospheric pressure. The resulting Joule-Thompson cooling forms solid carbon dioxide particles which traverse the surface boundary layer and strike the contaminated surface. In some cases the carbon dioxide forms a soft material which can flow over the surface, displacing particles without leaving a residue. The technique requires extremely clean and pure carbon dioxide. Trace molecular contaminants, such as hydrocarbons, in the feed gas can condense into solid or liquid particles on the surface. Carbon dioxide is difficult and/or expensive to provide in ultra high purity, such as with less than parts per million levels of trace purities. Because of this problem, the carbon dioxide cleaning technique has not yet been shown to be effective in ultra clean silicon wafer applications.

U.S. Pat. No. 3,545,996 discloses a device for placing a pattern on the surface of stainless steel by impact of a hard particulate treating material from a nozzle contained in a housing and having a shield 42 which focuses the impinging treating material. The patent is not directed to surface cleaning.

U.S. Pat. No. 4,084,357 discloses a valve cleaning chamber having a window 18 for viewing the cleaning operation. Nozzles within the housing of the apparatus are directed to valves and provide a jet of compressed air containing abrasive material for cleaning of the valve surfaces.

U.S. Pat. No. 4,631,250 discloses an apparatus for cleaning photo resist film from a semi-conductor using a spray of fine ice and carbon dioxide particles. The particular apparatus is further described in U.S. Pat. No. 4,747,421.

U.S. Pat. No. 4,793,103 discloses a cryogenic deflashing apparatus which uses cryogenic conditions to embrittle materials to be cleaned and deflashed and then blasts plastic pellets at the embrittled piece to be deflashed to remove the flashing components.

U.S. Pat. No. 4,817,652 discloses a cleaning apparatus which may use liquids and gases including argon. Liquid cleaning agents are used to float contaminants off the surface to be cleaned or the fluid may be frozen and then partially melted to remove contaminants locked in the frozen residual cleaning media.

U.S Pat. Nos. 4,832,753 and 4,936,922 disclose cleaning systems using droplets of solvent. The apparatus includes a tray which slides along gas bearing operated tubes.

U.S. Pat. No. 4,974,375 discloses a chamber for cleaning semi-conductor wafers with a jet of ice particles of ultra pure water. The spray of ice particles contacts the semiconductor wafer to be cleaned at an angle on a rotating surface driven by a motor.

U.S. Pat. No. 5,009,240 discloses an apparatus for cleaning semi-conductor wafers by spraying a blast of ice particles against the wafer in which residual ice is removed by evaporation.

U.S. Pat. No. 4,962,891 discloses a nozzle apparatus for dispensing a mixture of solid particles and gaseous carbon dioxide. This nozzle is used to clean small particles from a substrate.

U.S. Pat. No. 1,899,626 discloses a burner apparatus having a multi apertured nozzle configuration.

The present invention overcomes the drawbacks of the prior art by providing a controlled atmosphere apparatus which dispenses a controllably directed spray of sublimable frozen particles for cleaning using a precise tracking means to administer the cleaning in a careful and calibrated manner so as to overcome the deficiencies experienced by the prior art. These attributes are described with greater clarity with regard to the present invention which is set forth below.

BRIEF SUMMARY OF THE INVENTION

The present invention is an apparatus for cleaning undesired material from a solid surface using a projected spray of discrete, substantially frozen, cleaning particles, which can vaporize after impingement on the solid surface, comprising:

a generally closed housing in which a solid surface to be cleaned is accommodated in having entry means for introducing a solid surface into the housing;

a nozzle situated in the housing so as to project a spray of discrete substantially frozen cleaning particles at the solid surface to be cleaned;

means for supplying a fluid cleaning media to the nozzle for generation of substantially frozen cleaning particles;

means for removal from the housing of the undesired material cleaned from the solid surface;

movable support means in the housing for supporting the solid surface to be cleaned and having means to controllably move the solid surface from the entry means to a position juxtaposed to the projected spray of the nozzle; and means for supplying a flush gas to the housing to control the atmosphere in the housing and to assist the removal of the undesired material cleaned from the solid surface.

Preferably, the nozzle comprises a nozzle compartment having a plenum for receiving fluid cleaning medium, a first orifice connected to a supply of a fluid cleaning medium and the plenum, a second orifice comprising a plurality of aligned apertures for discharging the cleaning medium from the plenum and projecting the spray of discrete substantially frozen cleaning particles at the solid surface.

Preferably, the housing has the viewing window for operator observation of a cleaning operation.

Preferably, the support means comprises a substantially flat table having fastening means to affix the solid surface to the table, track means for controllably moving the table under the projected spray of the nozzle and actuation means for moving the table on the track means.

Preferably, the housing has a raised chamber accommodating the nozzle with an opening juxtaposed to a lower chamber accommodating the support means.

Preferably, the raised chamber includes flow baffles at the opening for controlling the spray of the cleaning particles.

Preferably, the supply means has a filter for removal of contaminants from the fluid cleaning medium.

Preferably, the supply means has a cooling means for initially cooling the fluid cleaning media before entering the nozzle.

Preferably, the table is movably mounted on a linear track means for linear movement under the projected spray of the nozzle.

Alternatively, the table is movably mounted on a circular track means for arcuate movement under the projected spray of the nozzle.

Preferably, the supply means includes a separate supply of argon gas and a separate supply of nitrogen gas and a means for blending the gases together.

Preferably, the nozzle is positioned at a 0–90° angle to the plane of the solid surface, preferably 45°.

Preferably, the fastening is a mechanical clip. Alternatively, the fastening means is a suction device. Further alternatively, the fastening means is an electrostatic chuck. Yet further, the fastening means may be an electromagnetic device.

Preferably, the housing includes an insulation barrier to allow the apparatus to operate below ambient temperature conditions.

Preferably, the means for introducing a solid substrate is an aperture which communicates with other apparatus for diverse processing of semi-conductor materials.

Preferably, the means for removal comprises an appropriate conduit and a vacuum pump for removing the undesired material and used cleaning medium from the housing.

Preferably, the means for supplying a flush gas includes means for supplying an inert sweep gas to the housing.

BRIEF DESCRIPTION OF THE DRAWINGS

FIG. 3A is an enlarged view in partial section of the nozzle assembly of FIG. 1.

FIG. 3B is an enlarged exploded view in perspective of the subassembly of FIG. 3A.

FIG. 3C is an enlarged perspective view in partial section of the nozzle used in the preferred embodiment illustrated in FIG. 3A.

DETAILED DESCRIPTION OF THE INVENTION

Figure 1:
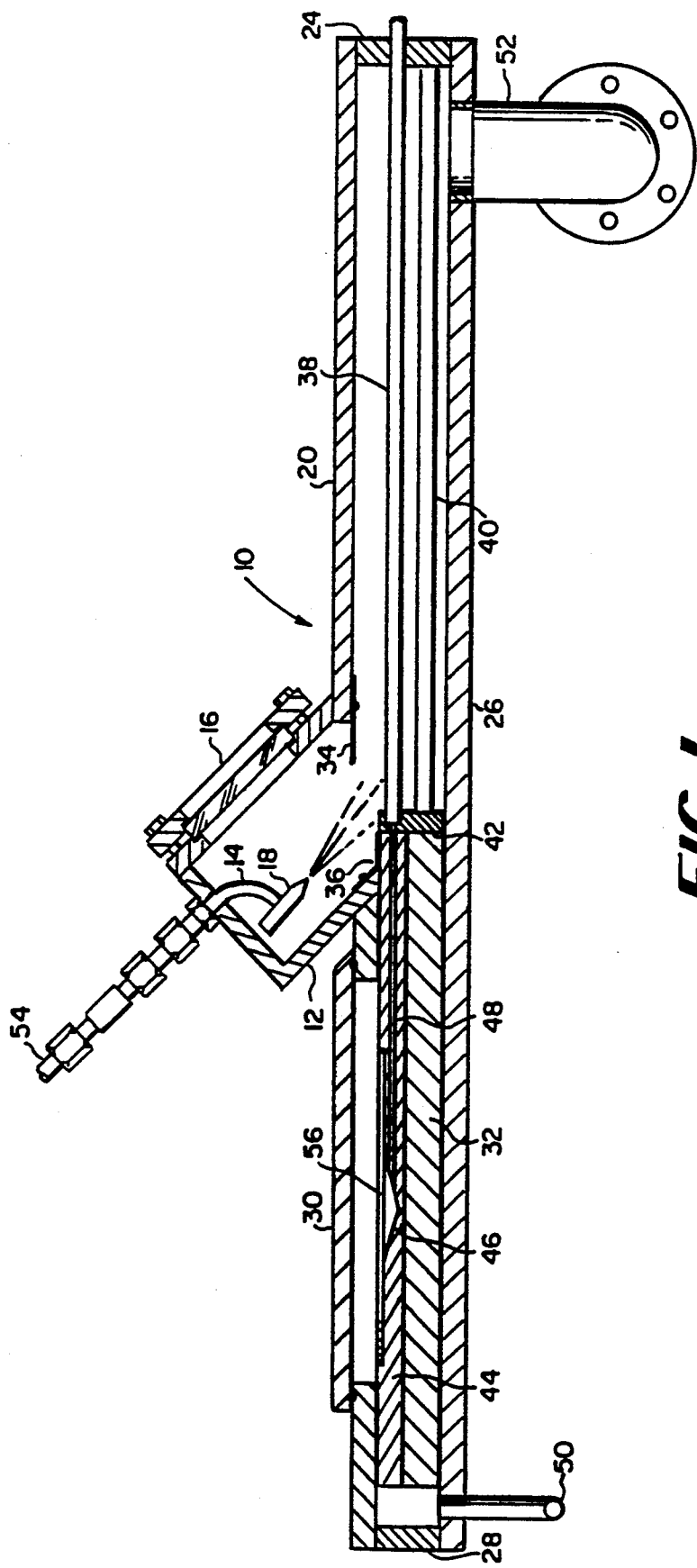
FIG. 1 is a side elevation in section showing the apparatus in accordance with a preferred embodiment of the present invention.

The apparatus of the present invention may utilize a process of cleaning with a cryogenic argon aerosol as described in U.S. Pat. No. 5,062,898, which is hereby incorporated herein in its entirety by reference. The process, which is operable in the apparatus of the present invention, comprises the following parameters.

The present invention uses an at least substantially solid argon particle-containing aerosol to "sandblast" contaminated surfaces. Argon is an inert substance which is not harmful to silicon wafers or microcircuits. Argon can be produced in ultrahigh purity economically. The argon can be used alone or mixed with ultrapure nitrogen in the present invention. The nitrogen remains in the gaseous phase and serves as a carrier medium to impart high velocities to the argon particles. The addition of nitrogen to the argon also permits higher expansion ratios which enhances the Joule-Thompson effect and permits increased cooling. The mixture ratio of argon to nitrogen may range from approximately 10% to 100% by volume of argon.

The previously purified argon or argon/nitrogen mixture is first filtered free of any remaining contaminating particles and preferably pre-cooled for example in a heat exchanger. Both components may remain in the gaseous phase following the pre-cooling operation. Pre-cooling also permits partial condensation and removal of any remaining trace impurities onto the heat exchanger walls. Pre-cooling may be combined with simultaneous removal of trace impurities using a molecular sieve or catalytic impurities removal device or an impurities getter located upstream of the heat exchanger. Such methods for removing trace molecular impurities from inert gases are well known in the field. The pressure of the pre-cooled mixture is typically held in the range of 20 psig to 690 psig, preferably 20 psig 100 psig. The temperature of the pre-cooled mixture is typically in the range −190° F. to −300° F. for the first pressure range above and −250° F. to −300° F. for the second pressure range above.

The pre-cooled mixture is then expanded in a nozzle or expansion valve to a lower pressure. The pressure of the expanded mixture may range from high vacuum to greater than atmospheric pressure. The resulting Joule-Thompson cooling serves to condense and liquify or solidify argon particles. For the purpose of this invention, the argon may form liquid particles as well as solid particles and still be efficacious for cleaning. It is preferred to form solid particles, but if at least a substantial portion of the argon particles are solid the cleaning process is significantly improved over prior techniques. Argon particles may condense through a process of homogeneous nucleation. The resulting cryogenic aerosol is then directed at an inclined angle (typically 45°) toward a contaminated surface to be cleaned. The jet is typically at a vertical distance of approximately 1/16" to several inches above the contaminated surface. The gas mixture is expanded through a nozzle. The nozzle geometry may vary. The present invention has been shown to be effective for circular nozzles and slit nozzles. Slit nozzles are well suited for broad surfaces such as silicon wafers. Circular nozzles are well suited for more localized cleaning applications. Complete removal of surface contaminants is typically achieved within several seconds of exposure to the aerosol.

The argon cleaning technique has been shown to provide effective cleaning of silicon wafers. Examples of gaseous cleaning jets demonstrate that 0.624 micrometer (6240 angstrom) particles are not removed using conventional nitrogen gas jet cleaning techniques. However, the same particles are completely removed using the argon aerosol cleaning technique (approximately 100% effectiveness). The argon cleaner has also been shown to be effective in removing 1000 angstrom-size particles from bare silicon wafers and thick films of bearing grease from glass surfaces. In the context of the present invention, the term particles includes particles at the molecular size level.

Cleaning of contaminated surfaces is accomplished in this invention through a process of colliding argon particles at high velocity against the surface to be cleaned. The argon particles strike contaminating particles, films and molecules located on the surface. The collision imparts sufficient energy to the contamination to release it from the surface. The released contamination becomes entrained in the gas flow and is vented. The gaseous phase of the aerosol impinges against the surface and flows across it, forming a thin boundary layer. The dimensions of the contaminating material (particles, films, etc.) are typically so small that they exist completely within the low velocity boundary layer. Therefore, the gas phase alone cannot remove small contamination because of insufficient shearing force. However, the argon particles have significant inertia and are thus able to cross through the boundary layer to the surface.

The argon particles tend to decelerate as they pass through the boundary layer toward the surface. In order for cleaning to occur, the argon particles must traverse the boundary layer and strike the surface. A simple model assumes that the gas flow creates a boundary layer of thickness "h" having a negligible normal component of velocity. In order to strike the surface, the solidified argon particles must enter the boundary layer with a normal component of velocity equal to at least "h/t". The particle relaxation time "t" is given by:

$$t = 2a^2 \rho_p C / 9\mu \quad (1)$$

where "a" is the argon particle radius, "$\rho_p$" is the particle density, "$\mu$" is the dynamic viscosity of the gas and "C" is the Stokes-Cunningham slip correction factor which is given by:

$$1 + 1.246(\lambda/a) + 0.42(\lambda/a)\exp[-0.87(a/\lambda)] \quad (2)$$

"$\lambda$" is the mean free path of the gas molecules which is inversely proportional to the gas pressure.

The above analysis demonstrates that the cleaning process is most effective for argon particles having large mass or high initial velocity. The cleaning process is also enhanced at lower pressures due to the increased particle slip and at a lower gas viscosities due to the decreased decelerating drag force on the argon particles.

The argon particles are formed during the expansion process. The temperature drop associated with the expansion causes gaseous argon to nucleate and condense into at least substantially solid particles. Solid argon particles will form directly from the gas phase argon if the pressure of the mixture is lower than the argon triple point. If the pressure of the mixture is higher than the triple point the gaseous argon will first condense into liquid droplets before freezing into solid particles. The triple point of argon is at 9.99 psia (0.68 atm.), −308.9° F. (84° K.).

Figure 2:
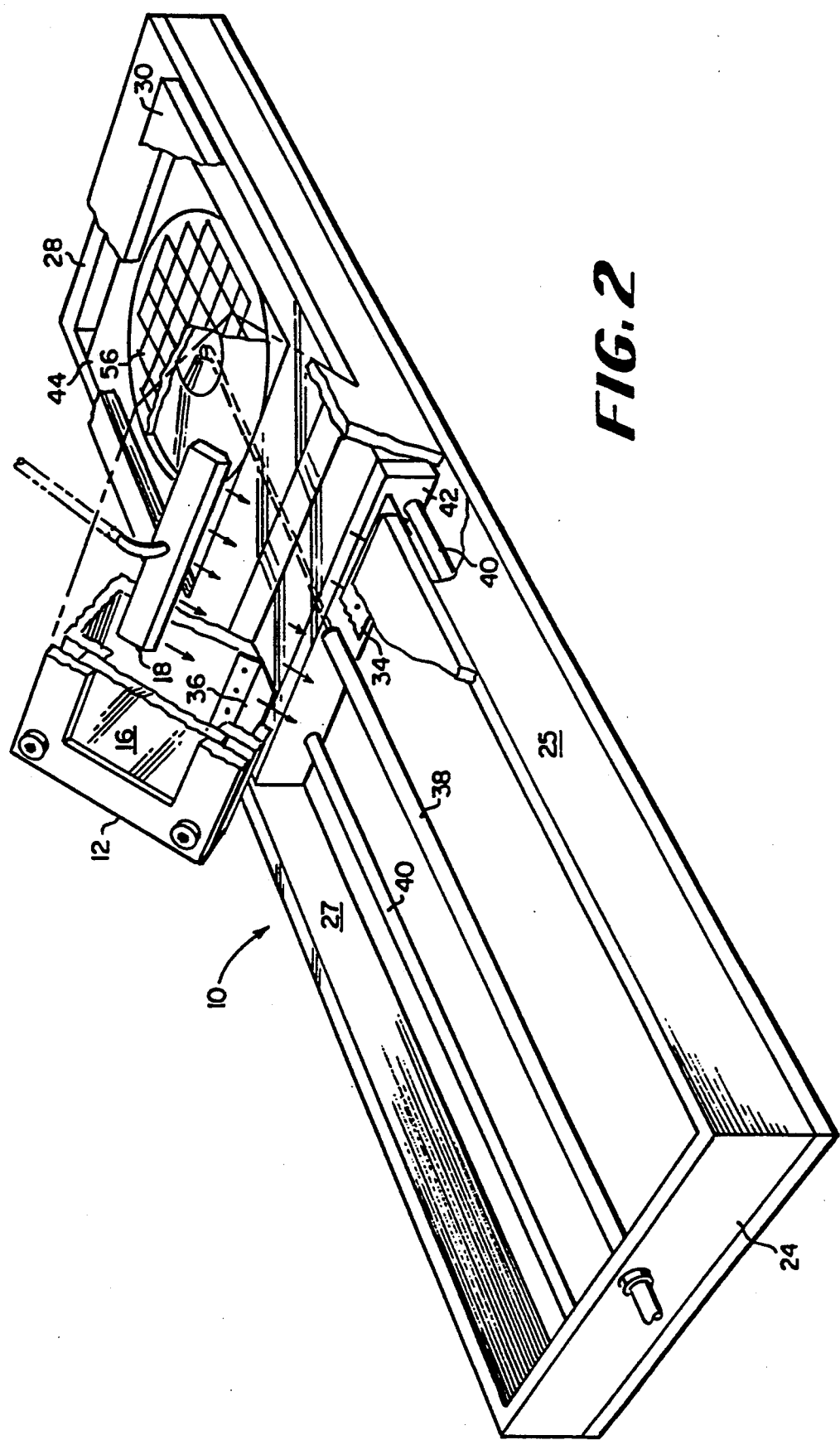
FIG. 2 is a detailed perspective view in partial section of the preferred embodiment illustrated in FIG. 1.

The apparatus of the present invention will now be set forth in greater detail with reference to a preferred embodiment illustrated in FIG. 1. The solid surface cleaning apparatus 10 is used for removing adhered contaminating particles or undesired material from a solid surface, such as a silicon semi-conductor wafer 56, using a projected spray of discrete substantially frozen cleaning particles. The spray is preferably a mixture of nitrogen and argon at appropriate temperatures and pressure letdown, such that the argon emanating from the spray freezes into discrete, small particles that impact the semi-conductor wafer to dislodge contaminating particles. The particles are then entrained in a carrier gas or removed by vacuum along with the argon particles which may have sublimed to the gaseous state. The apparatus 10 comprises a housing having an upper wall 20, end walls 24 and 28 and a lower wall 26. Side walls 25 and 27 are not illustrated in this figure but are illustrated in FIG. 2.

The semi-conductor silicon wafer 56 is introduced into the apparatus 10 through an entry door 30 comprising an aperture which may be open to the outside environment or may communicate with other workstations or apparatus for diverse processing of semi-conductor materials. The wafer 56 sits on a support means comprising a table 44. The table 44 rests in part on a bed element 32 and a track 40 comprising two parallel rods which pass through an end block 42 of the table 44 to guide and control movement of the table 44 along the length of the track 40 in the housing 10. The table 44 is actuated for movement longitudinally in the housing 10 and along track 40 by actuation rod 38 which reciprocates back and forth through end wall 24 by manual or automatic means. The wafer 56 is detachably affixed to the table 44 by a fastening assembly which is illustrated as a vacuum sump 46 in table 44 which draws vacuum through line 48 that continues through actuation rod 38 to an outside vacuum source. This places a vacuum under wafer 56 which effectively adheres it to the table 44. Other fastening means can be utilized including a mechanical clip, an electrostatic chuck or an electromagnetic device, none of which are illustrated, but which are well known in fastening arts.

The walls 20, 26, 24, 28, 25 and 27 constitute a lower chamber of the apparatus 10 to which an upper chamber 12 is connected which houses a nozzle 18. The upper chamber 12 is juxtaposed to the lower chamber and is open to the lower chamber. The upper chamber 12 also has a viewing window 16 so that operation of the nozzle and cleaning apparatus can be observed. A supply of cleaning medium is introduced in line 54 through a coupling and line 14 into the nozzle head 18 to be preferably sprayed as a rapidly expanding and cooling fluid medium in which argon particles freeze during expansion through nozzle 18 to produce a spray of atomized particles which contact the wafer 56 as it is drawn past the upper chamber 12 on table 44 by means of actuation rod 38.

In order to limit the exposure of the wafer 56 to only straight line impingement of frozen particles for cleaning purposes and to avoid eddy currents and slower velocity particles which do not impart sufficient cleaning action, the upper chamber 12 and the lower chamber are fitted with baffle plates 34 and 36. Baffle plate 36 comprises an angle plate having an obtuse angle between its upper and lower portions. The baffle 34, fastened to the underside of upper wall 20, has a planar configuration. These baffles 34 and 36 may be adjusted to open and close the effective aperture through which the spray from nozzle 18 passes to contact and impinge on the wafer 56 to be cleaned. The baffles are important to avoid recontamination of the wafer 56 to be cleaned and effectively isolate currents in upper chamber 12 from participation in the fluid dynamics of the lower chamber.

When a mixture of argon and nitrogen at elevated pressure and low temperatures below ambient is used as the cleaning medium, argon is formed in droplets by the nozzle 18 which effects a Joule-Thompson effect expansion of the fluid to create frozen particles which then preferably sublime after contact with the solid surface to be cleaned. This resulting used gaseous cleaning medium, as well as dislodged contaminating particles and undesired material, after dislodgement in the cleaning procedure, may be removed by vacuum through a removal means or exit port 52 connected to a vacuum pump. This vacuum action may be supplemented or supplanted by use of a sweep gas, preferably of inert nitrogen, introduced through entry port 50 comprising an appropriate means for supplying a flush gas, such as inert nitrogen, which serves to provide a controlled atmosphere inside the apparatus 10, as well as to force contaminating particles which have been cleaned from the solid surface to exit via the exit port 52.

The apparatus 10 is viewed in a perspective view in FIG. 2 in which a partial section is taken of the lower chamber and the upper chamber 12 showing the actuation rod 38, the track rods 40, the nozzle 18 and the wafer 56 comprising the solid surface to be cleaned and supported on the table 44. The sidewalls 25 and 27 of the apparatus 10 are also illustrated.

The baffles 34 and 36, the entry door 30, the window 16, the end block 42 and end walls 24 and 28 ar also illustrated.

FIG. 3A shows a partial cross section of the nozzle 18, the compartment 12, and the means for movably fixing the nozzle and its feed conduit 14 to the compartment 12. The nozzle conduit 14 is slideably engaged in a ball joint sleeve 402 having a ball joint 401 retained in appropriate bracing in compartment wall 12 so as to allow an extensive range of pivotal movement within the compartment 12. The ball joint 401 is sealed by the bracing with a pliable gasket or seal 403. The sleeve 402 is coupled preferably by a threaded connection with a clamp 405 which provides a gas-tight seal 407 of the sleeve and conduit 14, as well as providing an axial retention of the conduit 14 by means of a collar 409 and a split 411 in the sleeve clamp 405, which adjustably fixes the conduit 14 with regard to the compartment wall 12 by action of a bolt or fastener 413 running through the collar 409. By loosening the bolt 413, the conduit 14 and therefore the nozzle 18 can be adjusted within the sleeve 402 to change the distance of the nozzle from the surface to be cleaned. After the adjustment is made, the bolt 413 is clamped and the collar 409 retains the conduit 14 and therefore the nozzle 18 in the desired position, providing a specific distance of the nozzle discharge from the surface to be cleaned.

FIG. 3B shows the sleeve 402 with a ball end joint 401 in a disassembled form along with the clamp 405 showing the split 411 and the collar 409, which is actuated by the bolt 413.

With reference to FIG. 3C, the nozzle 18 is illustrated in a perspective view with the supply line 14. The nozzle comprises an upper plate 181 and a lower plate 183, each of which has a plenum 184 and 187, respectively, into which the cleaning medium emanating from conduit 14 is supplied. Sandwiched between the upper and lower plates 181 and 183 is an intermediate plate 182 having an annular space 186 which matches the plenum chambers in upper and lower plates 181 and 183. The intermediate plate 182 has a series of small aligned apertures 185 along its leading edge through which the cleaning medium from the plenum is discharged as a projected spray with rapid reduction in pressure to form atomized discrete droplets which freeze prior to impingement on the solid surface to be cleaned. Additional velocity and resulting pressure drop are provided by the inert carrier gas in the cleaning medium, such as a nitrogen blended into the argon cleaning medium. Conduit 14 enters the nozzle compartment 18 through a first orifice 188 which connects to the plenum, and the cleaning medium exits or is discharged from the nozzle 18 through a second orifice comprising a series of apertures 185. Although a preferred embodiment of the nozzle configuration is illustrated in FIG. 3, it is understood that other intermediate plates 182 might be utilized with a different sizing or pattern of second orifices comprising aligned apertures 185. This would result in different spray patterns and different size ranges of particles to be used as a cleaning spray. Although the cleaning action is most preferably achieved with frozen particles which sublime after impingement, it is contemplated that at least a portion of the cleaning medium may remain as liquid droplets which impinge the solid surface to be cleaned and displace contaminating particles and other undesired material prior to changing the liquid droplets to a gaseous state.

Figure 4:
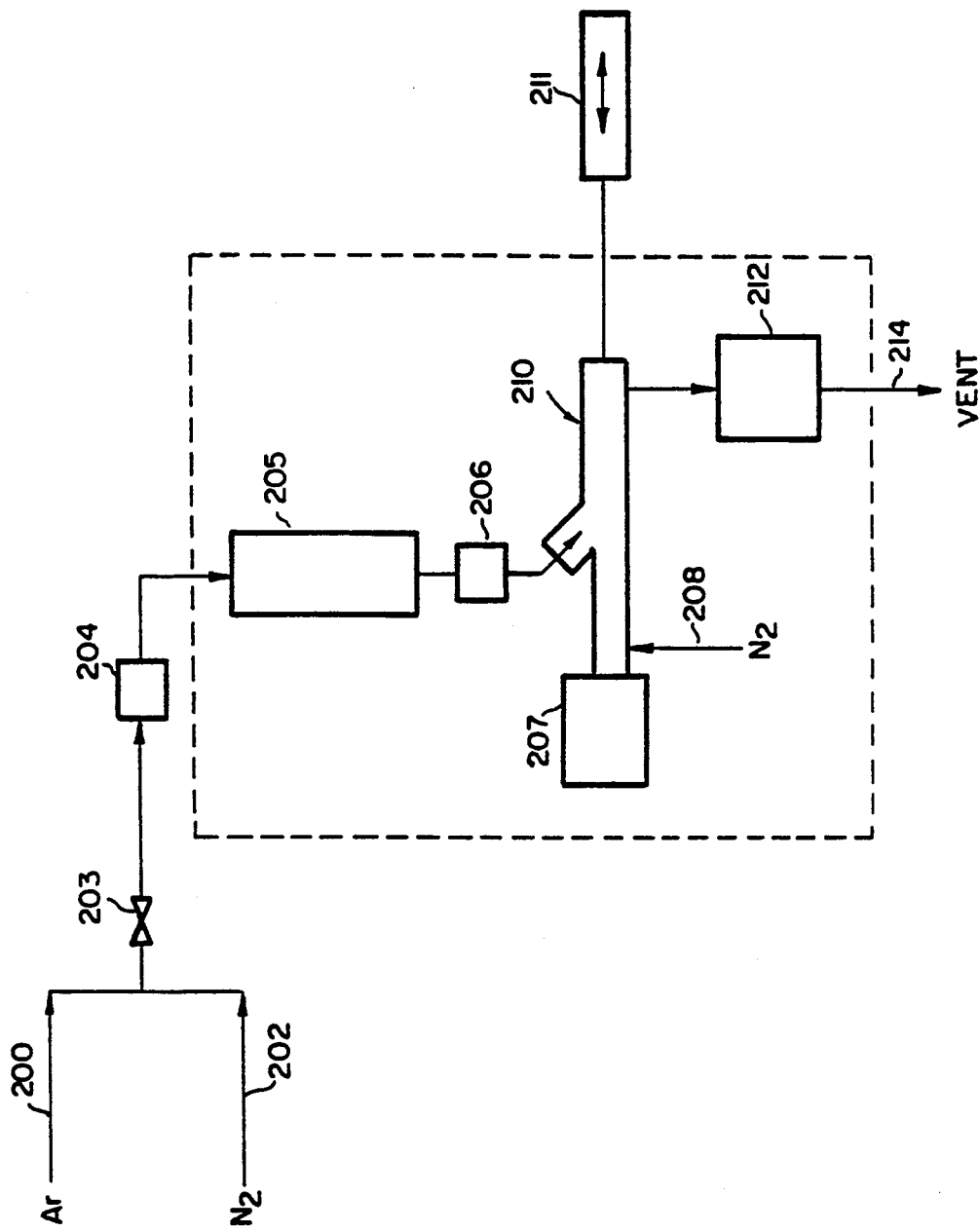
FIG. 4 is a schematic illustration of the overall apparatus of the present invention.

The apparatus of the present invention would typically be utilized in a combination with additional support apparatus as set forth in FIG. 4. In FIG. 4, are illustrated separate sources of argon 200 and nitrogen 202. Nitrogen may not in some cases be necessary for inclusion in the feed gas cleaning medium. A typical mixture for cleaning an 8 inch silicon wafer may, for example, consist of approximately 90% argon and 10% nitrogen at a pressure of approximately 6 atmospheres and flowing at approximately 450 standard liters per minute. These gases after admixture are controlled through a separate valve 203 and a filter 204 to remove particulate contaminants from the cleaning medium. The mixed and filtered feed gas cleaning medium is then introduced into a cooling heat exchanger 205 which chills the gas. This may comprise a coiled tubing immersed in a continuously replenished bath of liquid nitrogen or other appropriate low temperature coolant. Alternatively, the feed gas may be precooled by passing the mixture through a heat exchanger in direct thermal contact with a cryogenic refrigeration unit. The precooling heat exchanger 205 lowers the temperature of the feed gas mixture to near the liquefaction point of argon, but retains the mixture in a gaseous state in preparation for entry into the cleaning apparatus. The pre-cooler heat exchanger 205 also serves as a cryogenic trap to remove trace quantities of condensable impurities from the feed gas mixture. Such impurities, if not removed, could subsequently condense into particles causing new contamination on the solid surface to be cleaned. A second filter 206, located after the cooling heat exchanger 205, but before the cleaning chamber, serves to remove condensed impurity particles which are formed during the precooling operation, but which do not deposit out on the heat exchanger surfaces. The chilled cleaning media then enters the cleaning apparatus 210, which is shown with a separate mechanism 211 for moving the solid surface table in a linear fashion under the nozzle within the cleaning apparatus on the track identified with regard to FIG. 1. Preferably, the separate moving mechanism 211 would be located outside the cleaning chamber 210 and will be connected through a linkage and bulkhead feed through to the table. Alternatively, this mechanism might be a handle for manual operation by an operator. FIG. 4 also illustrates a separate captured vent system or vacuum system 212 to continuously remove gas and released contaminant particles from the cleaning apparatus 210. This system 212 should include provision to rewarm the expended gas mixture before sending it to a vacuum pump or vent fan. Also, this system may include an appropriate back pressure regulating device to control the upstream pressure in the cleaning apparatus and a vacuum system trap to prevent backstreaming contamination from entering the cleaning apparatus. The removed or cleaned contaminant particles or undesired materials are then vented in line 214 as appropriate. This vacuum operation can be enhanced or supplanted with a source of flush gas comprising inert nitrogen, preferably administered through the inlet 208.

Finally an appropriate entry-exit system to the cleaning apparatus for the solid surface to be cleaned is illustrated at 207. Such a system may consist for example of one or two gate type valves in place of the manually operated hatch indicated in FIG. 1. The entry-exit system may, in addition, be serviced by a substrate handling robot designed to withstand the environmental conditions of the cleaning chamber and to contribute a minimum of new contamination to the solid surface being cleaned. The robot may, in one embodiment of the invention, be located in a separate isolation chamber external to the cleaning apparatus, but communicating with the cleaning apparatus through a gate type valve or similar device. For example, the cleaning apparatus may in one embodiment of the invention consist of one processing module of a clustered substrate processing system. In such an application, the primary substrate handling device would consist of a robot which is located in the central platform of the cluster system and which services other processing modules. In another embodiment of the invention, the cleaning apparatus may be serviced from a dedicated entry-exit system. In such an embodiment, the cleaner apparatus and entry-exit system would function as a stand-alone system, not directly integrated to other substrate processing equipment.

Additional features might be included which are not illustrated in FIG. 4. This includes provision for heating the solid surface to be cleaned prior to and/or subsequent to the cleaning operation. Such heating may be provided, for example, by electrical resistance heaters embedded in the table carrying the solid surface and in direct thermal contact with the solid surface or by an infrared light source in direct view of the solid surface to be cleaned. This avoids recondensing or condensing particles, which may comprise contamination, as well as assisting in the sublimation of argon after it impinges the surface during the cleaning operation.

Additionally, instrumentation to monitor the operating condition of the cleaning apparatus can be provided. Such instrumentation is well known in the art, but may include, for example, pressure, temperature and flow sensors located at various points throughout the feed gas manifold, the feed gas cooling heat exchanger, the vacuum or vent system, the fastening means comprising a vacuum chuck, an inert flush gas system and actuation control. It is entirely possible that a manually or automatically actuated control system designed to operate the entire cleaning system in a synchronized manner may be provided, particularly with computer operation. This system would, for example, operate and/or coordinate the activities of the entry-exit gate valves, the robotic substrate handler, the solid surface heater, the solid surface support table mechanism, the feed gas cleaning medium on/off valve and the control system for the solid surface fastener or holder.

Figure 5A:
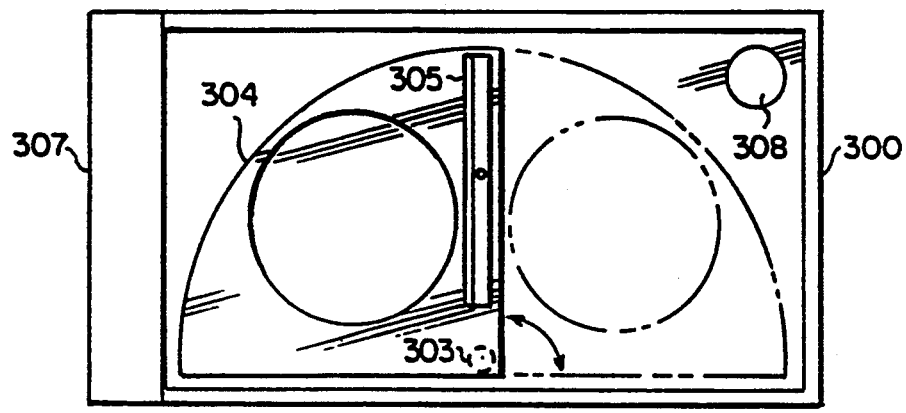
FIG. 5A is a plan view in partial section of an alternative embodiment of the present invention.
Figure 5B:
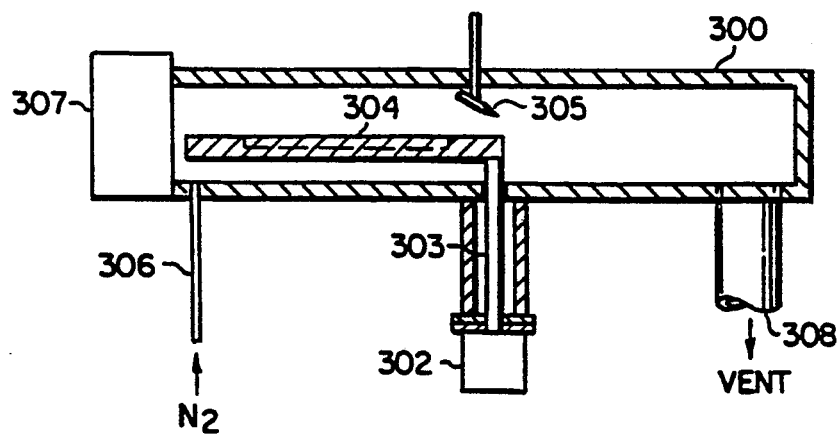
FIG. 5B is a side elevation in partial cross-section of the alternative embodiment of FIG. 5A.

An alternative apparatus is illustrated in FIG. 5A and FIG. 5B. This design incorporates all of the features of the previously described embodiment, but with a rotational rather than linear movement of the table carrying the solid surface during cleaning. The circular shaped substrate, such as a silicon wafer, is shown on a circular-segment shaped table 304 which rotates on axle 303 by means of a rotation mechanism 302 which may be a motor or manual operative drive. Such a design uses a rotational feed through the cleaning chamber rather than a linear feed through. The rotation mechanism 302 is located at the end of an uninsulated extension of the cleaning chamber housing 300. This extension allows the rotation mechanism 302 and the rotational feed through to operate at near ambient temperature, thereby eliminating the need for special low temperature mechanisms. This rotational design can, in some instances, provide a smaller overall "footprint" to the cleaning apparatus. This is because the external substrate carrier mechanism does not extend horizontally outward from the cleaning chamber. The external mechanism of the rotating design extends vertically from the cleaning chamber. However, in this rotational design, the total time of exposure to the aerosol of a point on the substrate depends on its distance from the pivot point. This is because points on the substrate closer to the pivot pass under the nozzle 305 more slowly than points on the table 304 further from the pivot. Therefore, in order to provide uniform cleaning effectiveness across the width of the table 304, the nozzle 305 should be designed to provide linearly increasing spray of frozen particles of greater intensity away from the pivot point 303. This variation in intensity can be accomplished by designing the nozzle 305 to have progressively larger apertures or progressively smaller spacing between the apertures of the nozzle in a direction away from the pivot point 303. This tendency toward nonuniform exposure behavior does not occur in the linear motion cleaner design of FIG. 1. Therefore, that former embodiment should be used with the nozzle having uniform aerosol intensity across its width.

With reference to FIG. 5A, the rotational embodiment is shown with a gate 307 introducing a solid surface to be cleaned into the housing 300 which is evacuated through an exit port 308 for removing gas medium and cleaned or removed contaminating particles and undesired material. The table 304 is shown in illustration to rotate under the nozzle 305 by means of the axle 303. With regard to FIG. 5B, the alternative embodiment is shown in a partial elevation view with the gate or housing opening aperture 307 for the housing 300 in which the nozzle 305, the table 304, the pivot point 303 and the actuation means 302 are shown in addition to the vent or exit orifice 308 and a flush gas entry orifice 306.

Either configuration of cleaning apparatus with linear movement or rotational movement may be used in a vertical inclination so as to further diminish the opportunity for contaminating particles to readhere to the solid surface being cleaned. Either apparatus may also be used in combination with an external insulating blanket to allow for maximum flexibility in maintaining temperature conditions inside the housing at above or below ambient conditions depending upon desirability. The present invention overcomes the disadvantages of the prior art systems by providing a controlled cleaning facility to generate contamination-free argon or other cryogen aerosols for cleaning solid surfaces of contaminating particles or other undesired materials such as films or layers. The cleaning chamber of the present invention provides optionally thermal insulation, thereby allowing cold aerosol or frozen particle formation. The cleaning chamber also provides an enclosure for a clean inert atmosphere, thereby preventing recontamination of the substrate with particulate or molecular impurities after cleaning. The low temperatures associated with the cryogenic aerosol surface cleaning preclude cleaning in an open environment where condensable impurities may recontaminate the cold substrate.

The chamber also provides means for containing a partial vacuum. In some applications, an expansion of the precooled gas to a partial vacuum of approximately $\frac{1}{2}$ atmosphere is desirable. The triple point of argon is at 0.68 atmosphere and 84° K. Therefore, an expansion of the aerosol to a pressure of less than 0.68 atmosphere insures that only solid and gaseous argon will be present in the aerosol. Solid argon particles are able to more efficiently complete the sandblasting process of cleaning than are liquid argon droplets. Also, a lower pressure environment tends to reduce the decelerating drag force on the argon particles thereby allowing the particles to strike the substrate with greater energy. The invention also provides a means for exposing the contaminated solid surface to be cleaned with an aerosol in a controlled manner, thereby effecting removal of the contamination without overexposure of the potentially delicate solid surface. Such overexposure could lead to damage of the substrate. The invention accomplishes this controlled exposure by providing a means to accurately position the nozzle at a predetermined distance and angle with respect to the substrate and by providing a means to move the solid surface at a predetermined speed and direction under the operating nozzle. This invention is designed to provide as uniform a cleaning effectiveness across the solid surface to be cleaned as possible using a linear nozzle geometry and linear solid surface motion. The present invention is designed with an internal geometry which is intended to direct the aerosol spray and released contamination smoothly away from the substrate and toward the vent or exit orifice, thereby minimizing recontamination of the substrate. Recirculation of aerosol spray and any suspended contaminants is minimized through appropriate internal geometry. Also, backstreaming of aerosol and suspended contaminants into the hatch area is minimized through appropriate internal geometry and, in some cases, through continuous purging of the hatch area with gaseous nitrogen.

An example of the degree of cleaning effectiveness provided by the cryogenic aerosol process and using the apparatus described herein was performed. A test was performed in which a new 5-inch diameter silicon wafer was first examined for total surface cleanliness using a laser surface scanning instrument available from PMS Incorporated of Boulder, Colo. The scanner provided a histogram which indicated the number and sizes of all particles initially present on the wafer. A total of nine objects were initially found on the wafer in the size range of 0.3 to 10 micrometers. The silicon wafer was then intentionally contaminated with glass microspheres having a known diameter of 1.6 micrometers. These microspheres were deposited on the wafer in a dry condition. A subsequent scan of the same silicon wafer revealed a high degree of contamination. A total of 350 objects were now found on the wafer. Agglomeration of the glass microspheres caused the surface scanner to measure many objects larger in size than 1.6 micrometers. After cleaning in the cryogenic aerosol apparatus of the present invention, the same wafer was again scanned for particle contamination. The results indicated a total of eight objects on the clean wafer. This result demonstrates that the contaminated wafer can be essentially restored to its initial new condition using the cryogenic aerosol process in the cleaning apparatus of the present invention. This degree of cleaning effectiveness cannot easily be achieved using the conventional cleaning processes and apparatus of the prior art.

The present invention has been set forth with regard to several preferred embodiments; however, the scope of the invention should be ascertained from the claims which follow.

I claim:

1. An apparatus for cleaning undesired material from a solid surface using a projected spray of discrete substantially frozen cleaning particles which can vaporize after impingement on the solid surface, comprising:
   a) a generally closed housing in which a solid surface to be cleaned is accommodated and having entry means for introducing a solid surface into said housing;
   b) a nozzle situated in said housing so as to project a spray of discrete substantially frozen cleaning particles at said solid surface to be cleaned;
   c) means for supplying a fluid cleaning medium to said nozzle for generation of substantially frozen cleaning particles;
   d) means for removal from said housing of said undesired material cleaned from said solid surface;
   e) movable support means in said housing for supporting said solid surface to be cleaned and having means to controllably move said solid surface from said entry means to a position juxtaposed to said projected spray of said nozzle; and
   f) means for supplying a flush gas to said housing to control the atmosphere in said housing and to assist the removal of said undesired material cleaned from said solid surface wherein said housing has a chamber accommodating said nozzle with an opening juxtaposed to a chamber accommodating said support means and said chamber accommodating said nozzle includes flow baffles at said opening for controlling said spray of said cleaning particles.

2. The apparatus of claim 1 wherein said nozzle comprises a nozzle compartment having a plenum for receiving fluid cleaning medium, a first orifice connected to a supply of a fluid cleaning medium and said plenum, a second orifice comprising a plurality of aligned apertures for discharging said cleaning medium from said plenum and projecting said spray of discrete substantially frozen cleaning particles at said solid surface.

3. The apparatus of claim 1 wherein said housing has a viewing window for operator observation of a cleaning operation.

4. The apparatus of claim 1 wherein said support means comprises a substantially flat table having fastening means to affix said solid surface to said table, track means for controllably moving said table under said projected spray of said nozzle and actuation means for moving said table on said track means.

5. The apparatus of claim 4 wherein said table is movably mounted on a linear track means for linear movement under the projected spray of said nozzle.

6. The apparatus of claim 4 wherein said table is movably mounted on a circular track means for arcuate movement under the projected spray of said nozzle.

7. The apparatus of claim 4 wherein said fastening means is a mechanical clip.

8. The apparatus of claim 4 wherein said fastening means is a suction device.

9. The apparatus of claim 4 wherein said fastening means is an electrostatic chuck.

10. The apparatus of claim 4 wherein said fastening means is an electromagnetic device.

11. The apparatus of claim 1 wherein said housing has a raised chamber accommodating said nozzle with an opening juxtaposed to a lower chamber accommodating said support means.

12. The apparatus of claim 11 wherein said raised chamber includes flow baffles at said opening for controlling said spray of said cleaning particles.

13. The apparatus of claim 1 wherein said supply means has a filter for removal of contaminants from said fluid cleaning medium.

14. The apparatus of claim 1 wherein said supply means has a cooling means for initially cooling said fluid cleaning medium before entering said nozzle.

15. The apparatus of claim 1 wherein said supply means includes a separate supply of argon gas and a separate supply of nitrogen gas and a means for blending the gases together.

16. The apparatus of claim 1 wherein said nozzle is positioned at a 0–90° angle to the plane of said solid surface.

17. The apparatus of claim 1 wherein said nozzle is positioned at a 45° angle to the plane of said solid surface.

18. The apparatus of claim 1 wherein said housing includes an insulation barrier to allow the apparatus to operate below ambient temperature conditions.

19. The apparatus of claim 1 wherein said means for introducing a solid substrate is an aperture which communicates with other apparatus for diverse processing of semiconductor materials.

20. The apparatus of claim 1 wherein said means for removal comprises an appropriate conduit and a vacuum pump for removing said undesired material and used cleaning medium from said housing.

21. The apparatus of claim 1 wherein said means for supplying a flush gas includes means for supplying an inert sweep gas to said housing.

22. An apparatus for cleaning undesired material from a solid surface using a projected spray of discrete substantially frozen cleaning particles which can vaporize after impingement on the solid surface, comprising:
   a) generally closed housing in which a solid surface to be cleaned is accommodated and having entry means for introducing a solid surface into said housing;
   b) a nozzle situated in said housing so as to project a spray of discrete substantially frozen cleaning particles at said solid surface to be cleaned;
   c) means for supplying a fluid cleaning medium to said nozzle for generation of substantially frozen cleaning particles;
   d) means for removal from said housing of said undesired material cleaned form said solid surface;
   e) movable support means in said housing for supporting said solid surface to be cleaned and having means to controllably move said solid surface from said entry means to a position juxtaposed to said projected spray of said nozzle; and
   f) means for supplying a flush gas to said housing to control the atmosphere in said housing and to assist the removal of said undesired material cleaned from said solid surface wherein said housing has a raised chamber accommodating said nozzle with an opening juxtaposed to a lower chamber accommodating said support means and said raised chamber includes flow baffles at said opening for controlling said spray of said cleaning particles.

* * * * *